US00RE46588E

(19) United States
(12) Reissued Patent
Edmond et al.

(10) Patent Number: US RE46,588 E
(45) Date of Reissued Patent: *Oct. 24, 2017

(54) GROUP III NITRIDE LED WITH UNDOPED CLADDING LAYER

(71) Applicant: Cree, Inc., Durham, NC (US)

(72) Inventors: John Adam Edmond, Durham, NC (US); Kathleen Marie Doverspike, Cary, NC (US); Hua-shuang Kong, Cary, NC (US); Michael John Bergmann, Raleigh, NC (US)

(73) Assignee: Cree, Inc., Durham, NC (US)

( * ) Notice: This patent is subject to a terminal disclaimer.

(21) Appl. No.: 14/743,528

(22) Filed: Jun. 18, 2015

Related U.S. Patent Documents

Reissue of:
(64) Patent No.: Re. 45,059
Issued: Aug. 5, 2014
Appl. No.: 13/439,292
Filed: Apr. 4, 2012

Which is a Reissue of:
(64) Patent No.: 7,692,209
Issued: Apr. 6, 2010
Appl. No.: 11/419,523
Filed: May 22, 2006

U.S. Applications:
(60) Continuation of application No. 10/948,363, filed on Sep. 23, 2004, now Pat. No. 7,071,490, which is a
(Continued)

(51) Int. Cl.
*H01L 33/00* (2010.01)
*H01L 33/32* (2010.01)
(Continued)

(52) U.S. Cl.
CPC ..... *H01L 33/32* (2013.01); *B82Y 20/00* (2013.01); *H01L 33/06* (2013.01);
(Continued)

(58) Field of Classification Search
CPC ..... H01L 33/32; H01L 33/02; H01L 33/06; H01S 5/343; H01S 5/34333; B82Y 20/00
See application file for complete search history.

(56) References Cited

U.S. PATENT DOCUMENTS 4,313,125 A 1/1982 Hartman et al.
4,918,497 A 4/1990 Edmond
(Continued)

FOREIGN PATENT DOCUMENTS

JP 06-283825 10/1994
JP 06-283825 A 10/1994
(Continued)

OTHER PUBLICATIONS

Kubota, et al; "Preparation and properties of III-V nitride thin films"; J. Appl. Phys. 66(7); Oct. 1, 1989; pp. 2984-2988.
(Continued)

*Primary Examiner* — James Menefee
(74) *Attorney, Agent, or Firm* — Myers Bigel, P.A.

(57) ABSTRACT

The present invention is a semiconductor structure for light emitting devices that can emit in the red to ultraviolet portion of the electromagnetic spectrum. The semiconductor structure includes a Group III nitride active layer positioned between a first n-type Group III nitride cladding layer and a second n-type Group III nitride cladding layer, the respective bandgaps of the first and second n-type cladding layers being greater than the bandgap of the active layer. The semiconductor structure further includes a p-type Group III nitride layer, which is positioned in the semiconductor structure such that the second n-type cladding layer is between the p-type layer and the active layer.

48 Claims, 7 Drawing Sheets

Related U.S. Application Data division of application No. 09/760,635, filed on Jan. 16, 2001, now Pat. No. 6,800,876.

(51) Int. Cl.

| | |
|---|---|
| ***H01S 5/323*** | (2006.01) |
| ***B82Y 20/00*** | (2011.01) |
| ***H01L 33/06*** | (2010.01) |
| ***H01S 5/343*** | (2006.01) |

(52) U.S. Cl.

CPC ..... *H01S 5/32341* (2013.01); *H01S 5/343* (2013.01); *H01S 5/34333* (2013.01)

(56) References Cited

U.S. PATENT DOCUMENTS

| | | | | |
|---|---|---|---|---|
| 5,027,168 | A | 6/1991 | Edmond | |
| 5,173,751 | A | 12/1992 | Ota et al. | |
| 5,247,533 | A | 9/1993 | Okazaki et al. | |
| 5,338,944 | A | 8/1994 | Edmond et al. | |
| RE34,861 | E | 2/1995 | Davis et al. | |
| 5,387,804 | A | 2/1995 | Suzuki et al. | |
| 5,393,993 | A | 2/1995 | Edmond et al. | |
| 5,408,120 | A | 4/1995 | Manabe et al. | |
| 5,523,589 | A | 6/1996 | Edmond et al. | |
| 5,585,648 | A | 12/1996 | Tischler | |
| 5,592,501 | A | 1/1997 | Edmond et al. | |
| 5,631,190 | A | 5/1997 | Negley | |
| 5,661,074 | A | 8/1997 | Tischler | |
| 5,670,798 | A | 9/1997 | Schetzina | |
| 5,679,965 | A | 10/1997 | Schetzina | |
| 5,684,309 | A * | 11/1997 | McIntosh | B82Y 20/00 257/101 |
| 5,726,462 | A | 3/1998 | Spahn et al. | |
| 5,739,554 | A | 4/1998 | Edmond et al. | |
| 5,747,832 | A | 5/1998 | Nakamura et al. | |
| 5,751,752 | A | 5/1998 | Shakuda | |
| 5,851,905 | A | 12/1998 | McIntosh et al. | |
| 5,862,167 | A | 1/1999 | Sassa et al. | |
| 5,866,440 | A | 2/1999 | Hata | |
| 5,874,747 | A | 2/1999 | Redwing et al. | H01L 33/007 257/103 |
| 5,880,491 | A | 3/1999 | Soref et al. | |
| 5,900,647 | A | 5/1999 | Inoguchi | |
| 5,917,848 | A | 6/1999 | Claisse et al. | |
| 5,978,398 | A | 11/1999 | Ramdani et al. | |
| 5,987,048 | A | 11/1999 | Ishikawa et al. | |
| 5,990,496 | A | 11/1999 | Kunisato et al. | |
| 6,028,877 | A | 2/2000 | Kimura | |
| 6,045,612 | A | 4/2000 | Hunter | |
| 6,046,464 | A | 4/2000 | Schetzina | |
| 6,048,813 | A | 4/2000 | Hunter | |
| 6,066,205 | A | 5/2000 | Hunter | |
| 6,067,310 | A | 5/2000 | Hashimoto et al. | |
| RE36,747 | E | 6/2000 | Manabe et al. | |
| 6,072,189 | A | 6/2000 | Duggan | |
| 6,072,819 | A | 6/2000 | Shakuda | |
| 6,078,064 | A | 6/2000 | Ming-Jiunn et al. | |
| 6,084,899 | A | 7/2000 | Shakuda | |
| 6,118,801 | A | 9/2000 | Ishikawa et al. | |
| 6,153,894 | A | 11/2000 | Udagawa | |
| 6,201,262 | B1 | 3/2001 | Edmond et al. | H01L 21/02378 148/33 |
| 6,278,136 | B1 | 8/2001 | Nitta | |
| 6,296,956 | B1 | 10/2001 | Hunter | |
| 6,307,219 | B1 | 10/2001 | Oku et al. | |
| 6,459,100 | B1 | 10/2002 | Doverspike et al. | |
| 6,515,313 | B1 * | 2/2003 | Ibbetson | H01L 33/32 257/101 |
| 6,534,797 | B1 | 3/2003 | Edmond et al. | |
| 6,610,551 | B1 | 8/2003 | Doverspike et al. | |
| 6,657,234 | B1 | 12/2003 | Tanizawa | |
| 6,800,876 | B2 | 10/2004 | Edmond et al. | B82Y 20/00 257/103 |
| 6,906,352 | B2 | 6/2005 | Edmond et al. | |
| 7,034,328 | B2 | 4/2006 | Doverspike et al. | |
| 7,071,490 | B2 | 7/2006 | Edmond et al. | |
| 7,193,246 | B1 * | 3/2007 | Tanizawa | B82Y 20/00 257/101 |
| 2002/0008242 | A1 * | 1/2002 | Hata | B82Y 20/00 257/79 |
| 2003/0006418 | A1 | 1/2003 | Emerson et al. | |

FOREIGN PATENT DOCUMENTS

| | | | |
|---|---|---|---|
| JP | 10-321942 | | 12/1998 |
| JP | 11-186601 | * | 7/1999 |
| JP | 2000-091705 | A | 3/2000 |
| JP | 2001-036196 | | 9/2001 |
| KR | 2002-0082114 | A | 10/2002 |
| WO | WO 9918617 | A | 4/1999 |

OTHER PUBLICATIONS

Chan, et al.; "Metallization of GaN Thin Films Prepared by Ion Beam Assisted Molecular Beam Epitaxy"; Materials Research Society Symposium Proc. vol. 339; 1994; pp. 223-227.

Lin, et al., "Low resistance ohmic contacts on wide band-gap GaN", Appl. Phys. Lett. 64(8); Feb. 21, 1994; pp. 1003-1005.

Wright, et al.; "First-principles calculations for zinc-blende AlinN alloys"; Appl, Phys. Lett. 66(25); Jun. 19, 1995; pp. 3465-3467.

Sakai, et al; "GaN/GaInN/GaN Double Heterostructure Light Emitting Diode Fabricated Using Plasma-Assisted Molecular Beam Epitaxy"; Jpn. Appl. Phys. vol. 34; 1995; pp. 1429-1430.

McIntosh, et al; "Growth and characterization of AlInGaN quaternary alloys"; Appl. Phys. Lett. 68(1); Jan. 1, 1996; pp. 40-42.

Mack; "Characteristics of Indium-Gallium-Nitride Multiple-Quantum-Well Blue Laser Diodes Grown by MOCVD"; MRS Internet Journal of Nitride Semiconductor Research; vol. 2, Article 41: 1997.

Matsuoka; "Calculation of unstable mixing region in wurtzite in 1-x-y Ga x Al y N"; Appl. Phys. Lett. 71(1); Jul. 7, 1997, pp. 105-106.

Monemar, et al; "Radiative recombination in in 0.15 Ga 0.85 N/GaN multiple quantum well structures"; MRS Internet Journal Nitride Semiconductor Research; 1999.

Kariya, et al; "Mosaic Structure of Ternary Al 1-x In x N Films on GaN Grown by Metalorganic Vapor Phase Epitaxy"; Jpn. Appl. Phys. vol. 38; 1999; pp. 984-986.

Kariya, et al; "Structural characterization of Al 1-x In x N lattice-matched to GaN"; Journal of Crystal Growth 209; 2000; pp. 419-423.

Kariya, et al; "Structural Properties of Al 1-x In x N Ternary Alloys on GaN Grown by Metalorganic Vapor Phase Epitaxy"; Jpn. Appl. Phys., vol. 37; 1998; pp. 697-699.

Yamaguchi, et al; "Anomalous features in the optical properties of Al 1-x In x N on GaN grown by metal organic vapor phase epitaxy"; Applied Physics Letters, vol. 76(7); Feb. 14, 2000; pp. 876-878.

Sze, "Physics of Semi-conductor Devices," Second Edition (1981) pp. 681-703; 708-710.

Expert Report: "P-N Junction Location and Layer Conductivity in InGaN LED Chips Manufactured by" May 8, 2001.

Expert Report: "Structure and Analysis of InGaN LED Chips Manufactured by", Feb. 9, 2001.

Canadian Office Action Corresponding to Canadian Patent Application No. 2,567,739; dated: Aug. 28, 2012; 3 Pages.

European Office Action Corresponding to European Application No. 03 764 297; dated: Sep. 13, 2012; 4 Pages.

Korean Office Action Corresponding to Korean Patent Application No. 10-2012-7007324; dated: Jun. 13, 2012; Foreign Text, 5 Pages, English Summary, 1 Page.

Korean Office Action Corresponding to Korean Patent Application No. 10-2012-7007324; dated: Dec. 28, 2012; Foreign Text, 5 Pages, English Summary, 1 Page.

Exper Report: "P-N Junction Location and Layer Conductivity in InGaN LED Chips Manufactured by" May 8, 2001.

* cited by examiner

GROUP III NITRIDE LED WITH UNDOPED CLADDING LAYER

Matter enclosed in heavy brackets [ ] appears in the original patent but forms no part of the first and this reissue specification; matter printed in italics indicates the additions made by the first reissue. Matter enclosed in double heavy brackets [[ ]] appears in the first reissue patent but forms no part of this reissue specification; matter printed in bold face indicates the additions made by this reissue; a claim printed with strikethrough indicates that the claim was canceled, disclaimed, or held invalid by a prior post-patent action or proceeding.

BACKGROUND

This is a continuation of application Ser. No. 10/948,363 filed Sep. 23, 2004 now U.S. Pat. No. 7,071,490. Ser. No. 10/948,363 is a divisional of Ser. No. 09/760,635 filed Jan. 16, 2001 and now U.S. Pat. No. 6,800,876.

This application incorporates entirely by reference commonly-assigned U.S. Pat. No. 6,534,797 for Group III Nitride Light Emitting Devices with Gallium-Free Layers.

The present invention relates to semiconductor structures of light emitting devices, particularly light emitting diodes and laser diodes formed from Group III nitrides, which are capable of emitting light in the red to ultraviolet portions of the electromagnetic spectrum.

Photonic semiconductor devices fall into three categories: devices that convert electrical energy into optical radiation (e.g., light emitting diodes and laser diodes); devices that detect optical signals (e.g., photodetectors); and devices that convert optical radiation into electrical energy (e.g., photovoltaic devices and solar cells). Although all three kinds of devices have useful applications, the light emitting diode may be the most commonly recognized because of its application to various consumer products and applications.

Light emitting devices (e.g., light emitting diodes and laser diodes), herein referred to as LEDs, are photonic, p-n junction semiconductor devices that convert electrical power into emitted light. Perhaps most commonly, LEDs form the light source in the visible portion of the electromagnetic spectrum for various signals, indicators, gauges, and displays used in many consumer products (e.g., audio systems, automobiles, household electronics, and computer systems). LEDs are desirable as light output devices because of their generally long lifetime, their low power requirements, and their high reliability.

Despite widespread use, LEDs are somewhat functionally constrained, because the color that a given LED can produce is limited by the nature of the semiconductor material used to fabricate the LED. As well known to those of ordinary skill in this and related arts, the light produced by an LED is referred to as "electroluminescence," which represents the generation of light by an electric current passing through a material under an applied voltage. Any particular composition that produces electroluminescent light tends to do so over a relatively narrow range of wavelengths.

The wavelength of light (i.e., its color) that can be emitted by a given LED material is limited by the physical characteristics of that material, specifically its bandgap energy. Bandgap energy is the amount of energy that separates a lower-energy valence band and a higher energy conduction band in a semiconductor. The bands are energy states in which carriers (i.e., electrons or holes) can reside in accordance with well-known principles of quantum mechanics. The "bandgap" is a range of energies between the conduction and valence bands that are forbidden to the carriers (i.e., the carriers cannot exist in these energy states). Under certain circumstances, when electrons and holes cross the bandgap and recombine, they will emit energy in the form of light. In other words, the frequency of electromagnetic radiation (i.e., the color) that can be produced by a given semiconductor material is a function of that material's bandgap energy.

In this regard, narrower bandgaps produce lower energy, longer wavelength photons. Conversely, wider bandgap materials produce higher energy, shorter wavelength photons. Blue light has a shorter wavelength—and thus a higher frequency—than most other colors in the visible spectrum. Consequently, blue light must be produced from transitions that are greater in energy than those transitions that produce green, yellow, orange, or red light. Producing photons that have wavelengths in the blue or ultraviolet portions of the visible spectrum requires semiconductor materials that have relatively large bandgaps.

The entire visible spectrum runs from the violet at or about 390 nanometers to the red at about 780 nanometers. In turn, the blue portion of the visible spectrum can be considered to extend between the wavelengths of about 425 and 480 nanometers. The wavelengths of about 425 nanometers (near violet) and 480 nanometers (near green) in turn represent energy transitions of about 2.9 eV and about 2.6 eV, respectively. Accordingly, only a material with a bandgap of at least about 2.6 eV can produce blue light.

Shorter wavelength devices offer a number of advantages in addition to color. In particular, when used in optical storage and memory devices, such as CD-ROM optical disks, shorter wavelengths enable such storage devices to hold significantly more information. For example, an optical device storing information using blue light can hold substantially more information in the same space as one using red light.

The basic mechanisms by which light-emitting diodes operate are well understood in this art and are set forth, for example, by Sze, Physics of Semiconductor Devices, 2d Edition (1981) at pages 681-703.

The common assignee of the present patent application was the first in this field to successfully develop commercially viable LEDs that emitted light in the blue color spectrum and that were available in large, commercial quantities. These LEDs were formed in silicon carbide, a wide-bandgap semiconductor material. Examples of such blue LEDs are described in U.S. Pat. Nos. 4,918,497 and 5,027,168 to Edmond each titled "Blue Light Emitting Diode Formed in Silicon Carbide." Other examples of Group III nitride LED structures and laser structures are described in commonly assigned U.S. Pat. Nos. 5,523,589; 5,592,501; and 5,739,554.

In addition to silicon carbide, candidate materials for blue light emitting devices are gallium nitride (GaN) and its associated Group III (i.e., Group III of the periodic table) nitride compounds such as aluminum gallium nitride (AlGaN), indium gallium nitride (InGaN), and aluminum indium gallium nitride (AlInGaN). These materials are particularly attractive because they offer direct energy transitions with bandgaps between about 1.9 to about 6.2 eV at room temperature. More common semiconductor materials such as silicon, gallium phosphide, or gallium arsenide are unsuitable for producing blue light because their bandgaps are approximately 2.26 eV or less, and in the case of silicon, are indirect semiconductors and inefficient light emitters.

As known to those familiar with LEDs and electronic transitions, a direct transition occurs in a semiconductor when the valence band maxima and the conduction band minima have the same momentum state. This means that crystal momentum is readily conserved during recombination of electrons and holes so that the energy produced by the transition can go predominantly and efficiently into the photon, (i.e., to produce light rather than heat). When the conduction band minimum and valence band maximum do not have the same momentum state, a phonon (i.e., a quantum of vibrational energy) is required to conserve crystal momentum and the transition is called "indirect." The necessity of a third particle, the phonon, makes indirect radiative transitions less likely, thereby reducing the light emitting efficiency of the device.

Generally speaking, an LED formed in a direct bandgap material will perform more efficiently than one formed in an indirect bandgap material. Therefore, the direct transition characteristics of Group III nitrides offer the potential for brighter and more efficient emissions—and thus brighter and more efficient LEDs—than do the emissions from indirect to materials such as silicon carbide. Accordingly, much interest in the last decade has also focused on producing light emitting diodes in gallium nitride and related Group III nitrides.

Although Group III nitrides offer a direct transition over a wide bandgap energy range, the material presents a particular set of technical manufacturing problems. In particular, no commercially-viable technique has yet emerged for producing bulk single crystals of gallium nitride (GaN) that are capable of functioning as appropriate substrates for the gallium nitride epitaxial layers on which photonic devices would be formed.

All semiconductor devices require some kind of structural substrate. Typically, a substrate formed of the same material as the active region offers significant advantages, particularly in crystal growth and lattice matching. Because gallium nitride has yet to be formed in such bulk crystals, gallium nitride photonic devices must be formed in epitaxial layers on non-GaN substrates.

Recent work in the field of Group III nitride substrates includes and commonly assigned U.S. Pat. Nos. 6,296,956; 6,066,205; 6,045,612; 6,048,813; and 6,610,551; all of which are incorporated entirely herein by reference.

Using different substrates, however, causes an additional set of problems, mostly in the area of crystal lattice matching. In nearly all cases, different materials have different crystal lattice parameters. As a result, when a gallium nitride epitaxial layer is grown on a different substrate, some crystal lattice mismatching and thermal expansion coefficient mismatching will occur. The resulting epitaxial layer is referred to as being "strained" by this mismatch. Crystal lattice mismatches, and the strain they produce, introduce the potential for crystal defects. This, in turn, affects the electronic characteristics of the crystals and the junctions, and thus tends to degrade the performance of the photonic device. These kinds of defects are even more problematic in high power structures.

In early Group III nitride LEDs, the most common substrate for gallium nitride devices was sapphire (i.e., aluminum oxide $Al_2O_3$). Certain contemporary Group III nitride devices continue to use it.

Sapphire is optically transparent in the visible and ultraviolet ranges, but has a crystal lattice mismatch with gallium nitride of about 16 percent. Furthermore, sapphire is insulating rather than conductive, and is unsuitable for conductivity doping. Consequently, the electric current that must be passed through an LED to generate the light emission cannot be directed through a sapphire substrate. Thus, other types of connections to the LED must be made.

In general, LEDs with vertical geometry use conductive substrates so that ohmic contacts can be placed at opposite ends of the device. Such vertical LEDs are preferred for a number of reasons, including their easier manufacture and simpler incorporation into end-use devices than non-vertical devices. In the absence of a conductive substrate, however, vertical devices cannot be formed.

In contrast with sapphire, Gallium nitride only has a lattice mismatch of about 2.4 percent with aluminum nitride (AlN) and mismatch of about 3.5 percent with silicon carbide. Silicon carbide has a somewhat lesser mismatch of only about 1 percent with aluminum nitride.

Group III ternary and quaternary nitrides (e.g., indium gallium nitride and aluminum indium gallium nitride) have also been shown to have relatively wide bandgaps. Accordingly, such Group III nitride solid solutions also offer the potential for blue and ultraviolet semiconductor lasers and LEDs. These compounds, however, present the same problems as gallium nitride, namely, the lack of an identical single crystal substrate. Thus, each is typically used in the form of epitaxial layers grown on different substrates. This presents the same potential for crystal defects and associated electronic problems.

Accordingly, the assignee of the present invention has developed the use of silicon carbide substrates for gallium nitride and other Group III devices as a means of solving the conductivity problems of sapphire as a substrate. Because silicon carbide can be doped conductively, vertical LEDs can be formed. As noted, a vertical structure facilitates both the manufacture of LEDs and their incorporation into circuits and end-use devices.

As known to those familiar with Group III nitrides, their properties differ based on the identity and mole fraction of the present Group III elements (e.g., gallium, aluminum, indium). For example, increasing the mole fraction of aluminum tends to increase the bandgap, while decreasing the amount of aluminum tends to increase the refractive index. Similarly, a larger proportion of indium will decrease the bandgap of the material, thus permitting the bandgap to be adjusted or "tuned" to produce photons of desired frequencies. Changing the molar proportions in the solutions also changes the crystal lattice spacing. Accordingly, and despite much effort in this area, a need still exists for devices that incorporate vertical geometry, and that take advantage of the characteristics that result when the proportions of indium, aluminum, and gallium are desirably adjusted in the active layers, cladding layers, and buffer layers of Group III nitride photonic devices.

It is a further object of the present invention to provide light emitting devices having decreased nonradiative recombination and improved efficiency.

SUMMARY

Therefore, it is an object of the present invention to produce light emitting diodes and laser diodes from Group III nitrides in a manner that takes advantage of their favorable properties.

The invention meets these objects via a semiconductor structure that includes a Group III nitride active layer positioned between a first n-type Group III nitride cladding layer and a second n-type Group III nitride cladding layer. The active layer has a bandgap that is smaller than the respective bandgaps of the first and second n-type cladding layers. The semiconductor structure further includes a p-type Group III nitride layer, which is positioned in the semiconductor structure such that the second n-type cladding layer is between the p-type layer and the active layer.

In another embodiment, the second n-type Group III nitride cladding layer has a graded composition such that it is substantially lattice matched to the p-type Group III nitride layer at the junction with the p-type Group III nitride layer.

In another embodiment, the structure includes a third n-type Group III nitride layer positioned between the second n-type Group III nitride clad layer and the p-type Group III nitride layer. The third n-type Group III nitride layer preferably comprises the same material structure as the p-type Group III nitride layer such that a p-n homojunction is formed between the third n-type Group III nitride layer and the p-type Group III nitride layer.

The foregoing, as well as other objectives and advantages of the invention and the manner in which the same are accomplished, is further specified within the following detailed description and its accompanying drawings.

DETAILED DESCRIPTION

The present invention is a semiconductor structure for light emitting devices that can emit in the red to ultraviolet portion of the electromagnetic spectrum. The structure includes a Group III nitride active layer positioned between a first n-type Group III nitride cladding layer and a second n-type Group III nitride cladding layer. The second n-type cladding layer is characterized by the substantial absence of magnesium (i.e., magnesium may be present, but only in amounts that are so small as to have no functional effect on the semiconductor device). The semiconductor structure itself is further characterized by a p-type Group III nitride layer, which is positioned in the semiconductor structure such that the second n-type cladding layer is between the p-type layer and the active layer. In addition, the active layer has a bandgap that is smaller than each respective bandgap of the first and second n-type cladding layers. As used herein, the term "layer" generally refers to a single crystal epitaxial layer.

A particular conductivity type (i.e., n-type or p-type) may be unintentional, but is more commonly a result of specifically doping the Group III nitrides using the appropriate donor or acceptor atoms. It is desirable to include layers of opposite conductivity types in order to form a p-n junction in the device. Under forward voltage bias, minority carriers injected across the p-n junction recombine to produce the desired luminescent emissions. Appropriate doping of Group III nitrides is well understood in the art and will not be further discussed herein other than as necessary to describe the invention.

In general, the active layer and the cladding layers comprise Group IIII-nitride compounds. The Group III elements in such compounds may be aluminum, indium, gallium, or a combination of two or more such elements.

As will be understood by those having ordinary skill in the art, the molar fraction of aluminum, indium, and gallium in the active layer, the first n-type cladding layer, and the second n-type cladding layer may be generally expressed by the formula, $Al_xIn_yGa_{1-x-y}N$, where $0 \le x \le 1$ and $0 \le y < 1$ and $(x+y) \le 1$. In this regard, the relative concentrations of aluminum, indium, and gallium may vary from layer to layer. It will be understood by those skilled in the art, however, that a cladding layer cannot be indium nitride (i.e., y=1) because InN has the lowest bandgap of all possible combinations and the active layer cannot be aluminum nitride (i.e., x=1) because AlN has the highest bandgap of all possible combinations. It will be understood in these embodiments that the cladding layers will have a larger energy band gap than the active layer.

Figure 1:
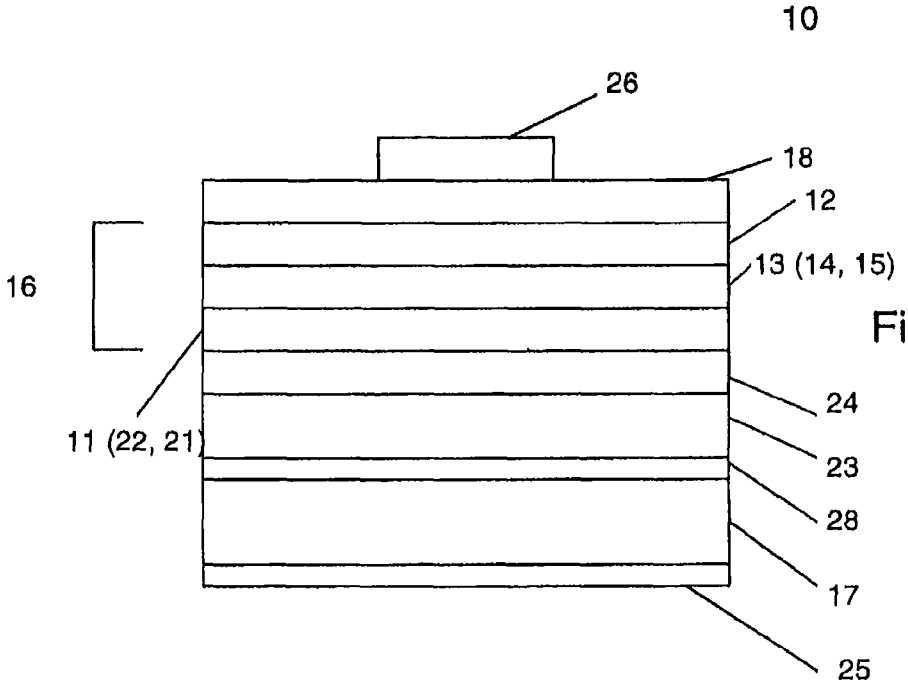
FIG. 1 is a cross-sectional schematic view of the aspects of a semiconductor structure for a light emitting device according to the present invention.

An understanding of the invention may be achieved with reference to FIG. 1, which is a cross-sectional schematic view of a semiconductor structure for an LED according to the present invention. The semiconductor structure, which is generally designated at 10, includes a first n-type cladding layer 11 of $Al_xIn_yGa_{1-x-y}N$, where $0 \le x \le 1$ and $0 \le y < 1$ and $(x+y) \le 1$.

The semiconductor structure 10 also includes a second n-type cladding layer of $Al_xIn_yGa_{1-x-y}N$, where $0 \le x \le 1$ and $0 \le y < 1$ and $(x+y) \le 1$, or in a more specific embodiment, an indium-free aluminum gallium nitride n-type cladding layer 12 having the formula, $Al_xGa_{1-x}N$, where $0 < x < 1$. In this regard, the range for the variable x excludes both 0 and 1, which will be understood by those skilled in the art as requiring the presence of both aluminum and gallium (i.e., an alloy of aluminum and gallium). As noted, the second n-type cladding layer 12 specifically excludes magnesium, and may be doped or undoped. The cladding layers may be unintentionally n-type, i.e. undoped.

An n-type active layer 13 having the formula $Al_xIn_yGa_{1-x-y}N$, where $0 \le x < 1$ and $0 \le y \le 1$ and $(x+y) \le 1$, is positioned *between* the first *n-type* cladding layer and the second *n-type* cladding layer 12. I*n* a more specific *embodiment*, the *active* layer 13 is *aluminum-free*, consisting essentially of an *indium* gallium nitride having the *formula*, $In_yGa_{1-y}N$, where $0 < y < 1$. In this regard, the range for the variable y excludes both 0 and 1, which will be understood by those skilled in the art as requiring the presence of both indium and gallium (i.e., an alloy of indium and gallium).

The semiconductor structure is further characterized by a p-type Group III nitride layer 18, which as previously noted, is positioned in the semiconductor structure such that the second n-type cladding layer 12 is between the p-type layer 18 and the active layer 13. In preferred embodiments, the p-type layer is made of gallium nitride (preferably magnesium-doped gallium nitride); indium nitride; or indium gallium nitride of the formula $In_xGa_{1-x}N$, where $0 < x < 1$.

Note that in embodiments wherein the p-type layer 18 is made of magnesium-doped gallium nitride, the second n-type cladding layer 12 should be thick enough to deter migration of magnesium from the p-type layer 18 to the active layer 13, yet thin enough to facilitate recombination of electrons and holes in the active layer 13. This helps to maximize emissions from the active layer 13. Moreover, because the p-n junction is not formed at the interface between an InGaN layer and an AlGaN layer—i.e. an InGaN/AlGaN p-n junction is avoided—the interface should have a reduced density of interface states. Such a reduction in interface states should result in more efficient recombination of carriers in the active layer, with a corresponding increase in overall device efficiency.

In another embodiment, the p-type layer comprises a p-type superlattice formed of selectively doped p-type Group III nitride layers selected from the group consisting of gallium nitride; indium nitride; and indium gallium nitride of the formula $In_xGa_{1-x}N$, where $0<x<1$. In particular, the superlattice is best formed from alternating layers of any two of these Group III nitride layers. In such a superlattice, alternating layers of gallium nitride and indium gallium nitride are most preferred.

The active layer 13 may be doped or undoped. As is known to those familiar with Group III nitride properties, the undoped material will generally be unintentionally n-type, and that is the case for the second n-type cladding layer 12. In particular, the first n-type cladding layer 11 and the second n-type cladding layer 12 have respective bandgaps that are each larger than the bandgap of the active layer 13.

Figure 2:
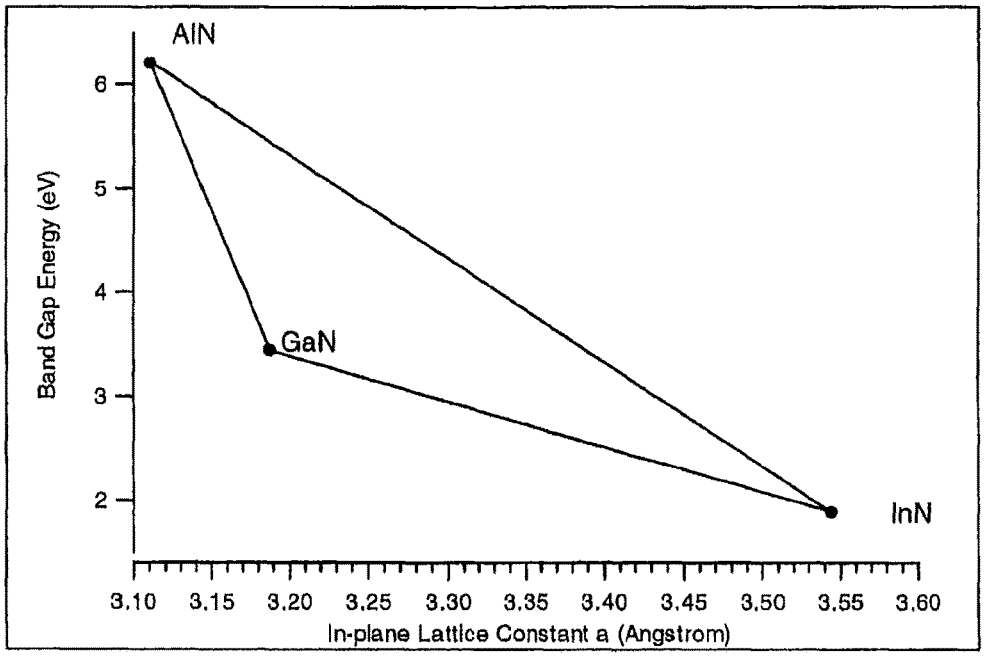
FIG. 2 is a plot of bandgap energy versus lattice parameter for Group III nitrides alloys of aluminum, indium, and gallium (assuming a linear interpolation)

The Group III mole fractions can be selected to provide these characteristics. For example, FIG. 2 theoretically describes bandgap energy versus lattice parameter. The triangular region of FIG. 2 represents the range of bandgap energies available for Group III nitrides of aluminum, indium, and gallium. FIG. 2 reveals that for any particular lattice parameter, eliminating gallium maximizes the bandgap energy (i.e., the bandgap for an aluminum indium nitride is defined by the AlN—InN segment).

As is known to those familiar with semiconductor structures-especially laser structures, the active layer must have a lower bandgap than the adjacent n-type cladding layers, and a higher refractive index than the adjacent cladding layers. Such a structure gives two benefits important for laser capability. First, if the active layer has the lowest bandgap, it may form a quantum well into which carriers tend to fall. This helps to enhance the device efficiency. Second, waveguiding occurs in the material that has the highest refractive index in the structure. Accordingly, when the bandgap of the active layer is less than that of the adjacent layers and its refractive index is greater than that of the adjacent layers, the lasing capabilities of the device are enhanced.

Moreover, as known to those of ordinary skill in this art, the composition of ternary and quaternary Group III nitrides can affect both their refractive index and their bandgap. Generally speaking, a larger proportion of aluminum increases the bandgap and decreases the refractive index. Thus, in preferred embodiments, in order for the cladding layers 11 and 12 to have a bandgap larger than the active layer 13 and a refractive index smaller than the active layer 13, the cladding layers 11 and 12 preferably have a higher fraction of aluminum or gallium as compared to the active layer 13. The larger bandgap of the cladding layers 11 and 12 encourages carriers to be confined in the active layer 13, thereby increasing the efficiency of the device. Similarly, the lower refractive index of the heterostructure layers 11 and 12 encourages the light to be more preferably guided along (i.e., confined to) the active layer 13.

As previously noted, the recited variables (e.g., x and y) refer to the structural layer they describe. That is, the value of a variable with respect to one layer is immaterial to the value of the variable with respect to another layer. For example, in describing the semiconductor structure, the variable x may have one value with respect to first n-type cladding layer 11, another value with respect to second n-type cladding layer 12, and yet another value with respect to active described layer 13. As will also be understood by those of ordinary skill in the art, the limitation $0\leq(x+y)\leq1$ in the expression $Al_xIn_yGa_{1-x-y}N$ simply requires that the Group III elements and the nitride be present in a 1:1 molar ratio.

Figure 3:
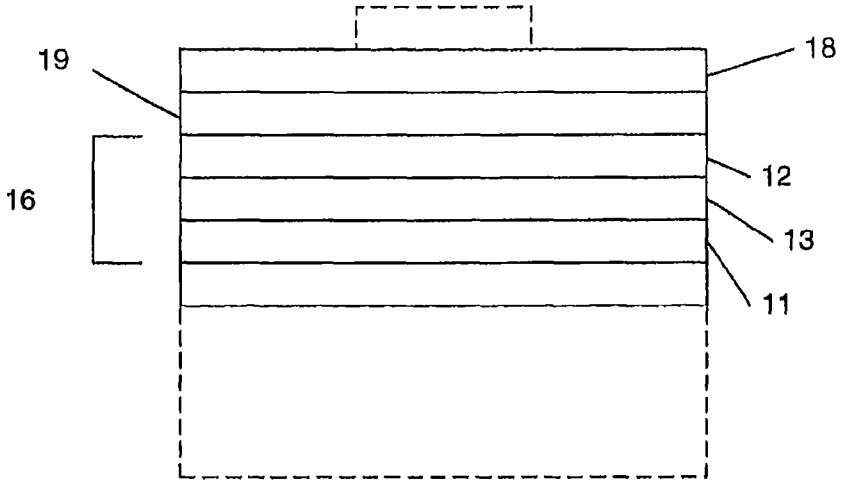
FIG. 3 is a cross-sectional schematic view of an embodiment of the semiconductor structure.

In preferred embodiments, active layer 13 comprises an InGaN layer having a mole fraction of indium between about 0.05 and 0.55. Referring to FIGS. 1 and 3, layer 12 is preferably an $Al_xGa_{1-x}N$ layer having a mole fraction of aluminum between about 0.14 and 0.24, while layer 11 is preferably an $Al_xGa_{1-x}N$ layer having a mole fraction of aluminum between about 0 and 0.15. Referring to FIG. 3, layer 19 is preferably an $Al_xGa_{1-x}N$ layer having a mole fraction of aluminum between about 0 and 0.15.

It will be appreciated by those of ordinary skill in the art that, as used herein, the concept of one layer being "between" two other layers does not necessarily imply that the three layers are contiguous (i.e., in intimate contact). Rather, as used herein the concept of one layer being between two other layers is meant to describe the relative positions of the layers within the semiconductor structure. Similarly, as used herein, the concept of a first layer being in contact with a second layer, "opposite" a third layer, merely describes the relative positions of the first and second layers within the semiconductor structure.

That said, in preferred embodiments of the semiconductor structure, the active layer 13 has a first surface 14 contiguous to the first n-type cladding layer 11 and a second surface 15 contiguous to the second n-type cladding layer 12. In other words, in such embodiments, the active layer 13 is sandwiched directly between the first n-type cladding layer 11 and the second n-type cladding layer 12, with no additional layers disturbing this three-layer isotype heterostructure (i.e. a heterostructure in which all of the materials have the same conductivity type), which is designated by the bracket 16. In another preferred embodiment, the p-type layer 18 is in contact with said second n-type cladding layer 12, opposite said active layer 13.

The structural designation "heterostructure" is used in a manner well understood in this art. Aspects of these structures are discussed, for example, in Sze, Physics of Semiconductor Devices, Second Edition (1981) at pages 708-710. Although the cited Sze discussion refers to lasers, it nonetheless illustrates the nature of, and the distinction between, homostructure, single heterostructure, and double heterostructure devices. Isotype heterostructures are discussed by Hartman et al. in U.S. Pat. No. 4,313,125, which is hereby incorporated herein in its entirety.

The semiconductor device may also include additional n-type layers of $Al_xIn_yGa_{1-x-y}N$, where $0\leq x\leq1$ and $0\leq y<1$ and $(x+y)\leq1$. In one embodiment depicted in FIG. 3, a third n-type layer 19 is positioned between second n-type cladding layer 12 and p-type layer 18. Preferably, the third n-type layer 19 has a first surface that is in contact with the p-type layer 18 and a second surface that is in contact with second n-type cladding layer 12.

Third n-type layer 19 is lattice matched with p-type layer 18. Preferably, third n-type layer 19 forms a p-n homojunction with p-type layer 18. Having a p-n homojunction reduces the number of interface states at the junction. Because such states may result in nonradiative recombination, reducing the number of such states improves the recombination efficiency, thus improving overall device efficiency.

The semiconductor device 10 can further comprise a silicon carbide substrate 17 that has the same conductivity type as first n-type cladding layer 11 (i.e., an n-type silicon carbide substrate). The silicon carbide substrate 17 preferably has a polytype/ of 3C, 4H, 6H, or 15R. The first n-type cladding layer 11 is positioned between the silicon carbide substrate 17 and the active layer 13. In one embodiment of the invention, the silicon carbide substrate 17 is in contact with the first n-type cladding layer 11, opposite the active layer 13 (i.e., there are no intervening layers between silicon carbide substrate 17 and first n-type cladding layer 11).

The silicon carbide substrate 17 is most preferably a single crystal. As is well understood by those of ordinary skill in this art, a high quality single crystal substrate provides a number of structural advantages that in turn provide significant performance and lifetime advantages. The silicon carbide substrate 17 can be formed by the methods described in U.S. Pat. No. 4,866,005 (now U.S. Pat. No. RE 34,861). Preferably, the silicon carbide substrate 17 and the first cladding layer 11 are n-type.

Figure 4:
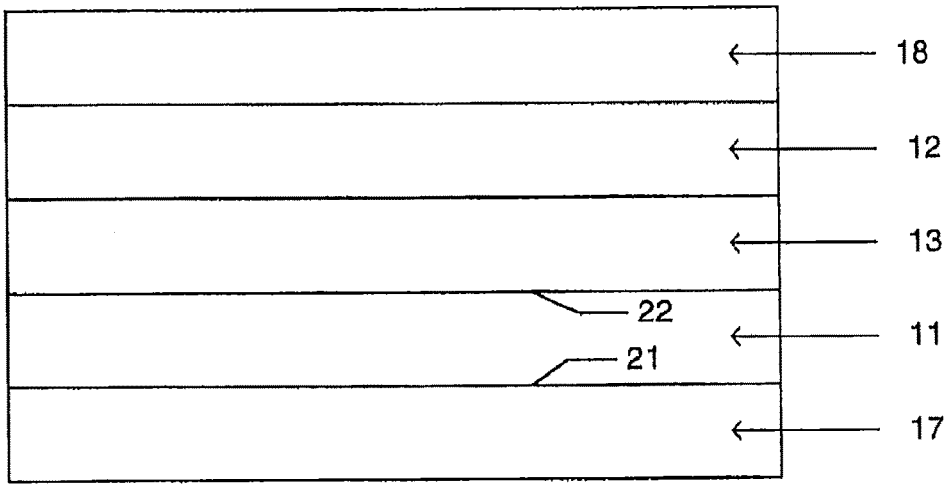
FIG. 4 is a cross-sectional schematic view of an embodiment of the semiconductor structure.

In a preferred embodiment depicted by FIG. 4, the first n-type cladding layer 11 has a first surface 21 that is in contact with the silicon carbide substrate 17 and a second surface 22 that is in contact with the active layer 13. In particular, the composition of the first n-type cladding layer 11 is progressively graded such that the crystal lattice at its first surface 21 more closely matches the crystal lattice of the silicon carbide 17, and the crystal lattice at its second surface 22 more closely matches the crystal lattice of the active layer 13. A sufficient mole fraction of indium should be present in the first n-type cladding layer 11 to ensure that it remains conductive at its first surface 21, adjacent to the silicon carbide substrate 17.

As will be understood by those of ordinary skill in the art, progressively grading embraces both step grading and linear grading. Accordingly, as used herein, the concept of more closely matching respective crystal lattices does not imply perfect matching, but rather that a layer whose composition has been progressively, compositionally graded so that its lattice at a layer interface is more compatible with the crystal lattice of the adjacent layer. When fabricating devices, a number of considerations must be balanced, one of which is lattice matching. If other factors are more important, a perfect or close lattice match may be less important, and vice versa.

In this regard, n-type cladding layers, especially aluminum indium nitride n-type cladding layers, can be selectively lattice matched to gallium-containing active layers, especially gallium nitride and indium gallium nitride active layers, in order to reduce strain and defects. In particular, aluminum indium nitrides are useful because they can be lattice matched to other Group III nitrides with lower bandgaps and therefore are useful as cladding layer materials. See FIG. 2.

As will be understood by those having ordinary skill in the art, lattice matching of the cladding layers and the active layer can be a one-sided lattice match (i.e., where a lattice match occurs on one side of the active layer) or a two-sided lattice match (i.e., where a lattice match occurs on both sides of the active layer).

Figure 5:
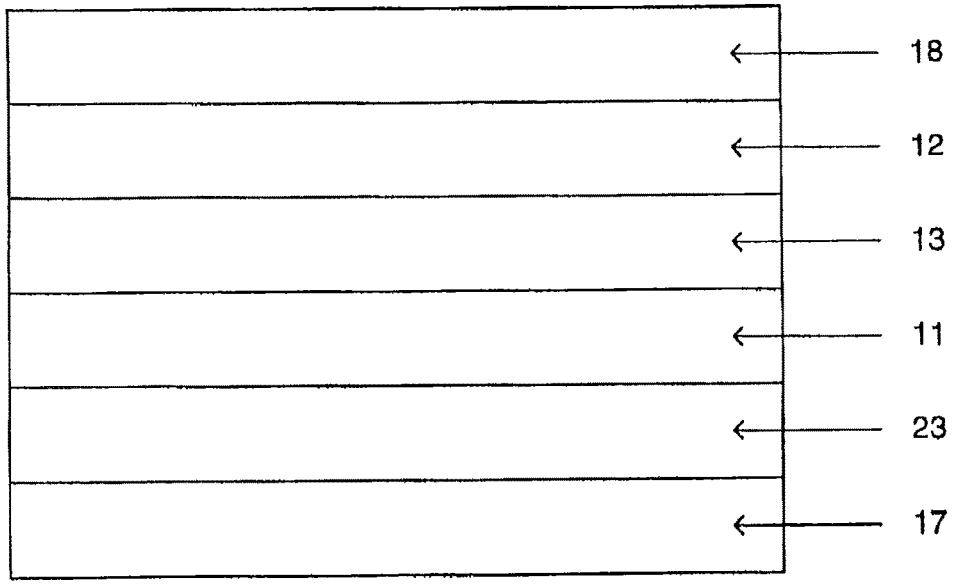
FIG. 5 is a cross-sectional schematic view of an embodiment of the semiconductor structure.

In another embodiment depicted by FIG. 5, the semiconductor structure further includes a conductive buffer layer 23 positioned between the silicon carbide substrate 17 and the first n-type cladding layer 11. In a variant of this embodiment, the conductive buffer layer 23 is sandwiched between the silicon carbide substrate 17 and the first n-type cladding layer 11, with no intervening layers. The conductive buffer layer 23 preferably consists essentially of aluminum gallium nitride having the formula $Al_xGa_{1-x}N$, where $0<x<1$. Alternatively, when the first n-type cladding layer 11 consists essentially of aluminum indium nitride having the formula, $Al_xIn_{1-x}N$, where $0<x<1$, the conductive buffer layer 23 preferably consists essentially of aluminum indium nitride having the formula, $Al_xIn_{1-x}N$, where $0<x<1$. Other acceptable buffers and buffer structures include those described in commonly assigned U.S. Pat. Nos. 5,523,589, 5,393,993, and 5,592,501, the contents of each hereby being incorporated entirely herein by reference.

Figure 6:
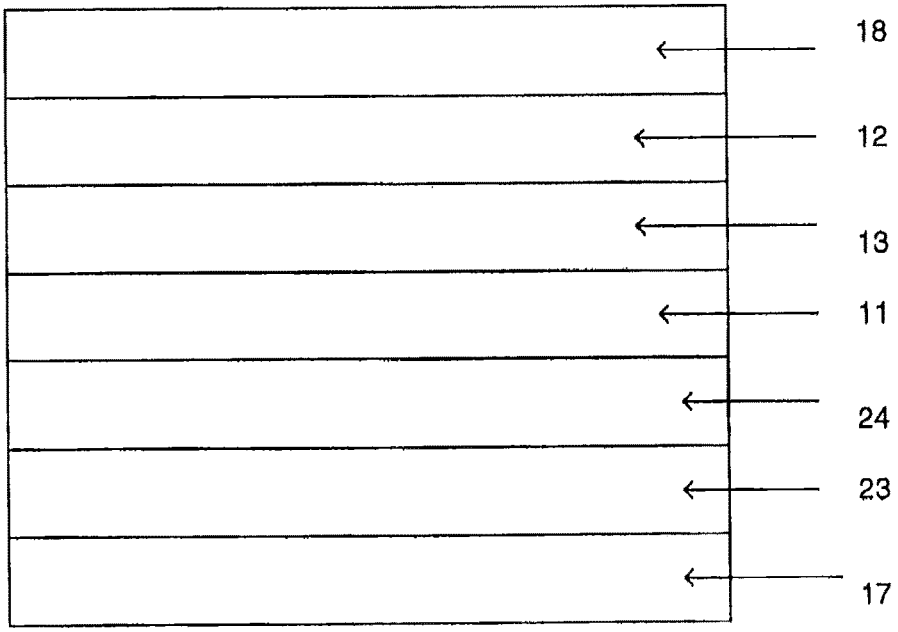
FIG. 6 is a cross-sectional schematic view of an embodiment of the semiconductor structure.

To facilitate the transition between the first n-type cladding layer 11 and the conductive buffer layer 23, the semiconductor structure can further include a Group III nitride transition layer 24, preferably formed of gallium nitride, that is positioned between the conductive buffer layer 23 and the first n-type cladding layer 11. See FIG. 6. The transition layer 24 has the same conductivity type as the first n-type cladding layer 11 (i.e., an n-type transition layer).

Figure 7:
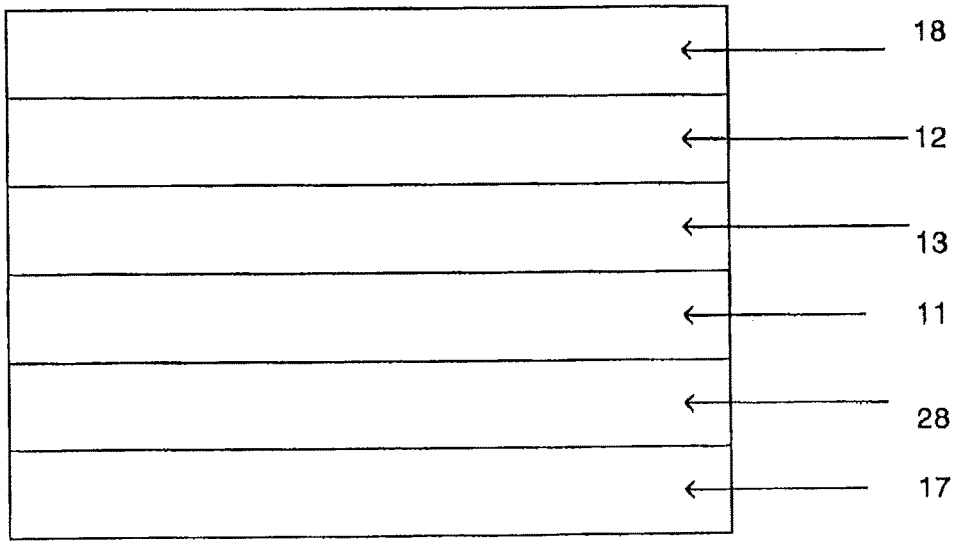
FIG. 7 is a cross-sectional schematic view of an embodiment of the semiconductor structure.

Alternatively, as depicted by FIG. 7, the conductive buffer layer 23 and transition layer 24 can be replaced by discrete crystal portions 28 that are disclosed more fully in commonly assigned U.S. Pat. No. 6,201,262 for "Group III Nitride Photonic Devices on Silicon Carbide Substrates with Conductive Buffer Interlayer Structure," which is incorporated entirely herein by reference.

In yet another embodiment, the semiconductor structure 10 further includes a first ohmic contact 25 and a second ohmic contact 26. As indicated in FIG. 1, the first ohmic contact 25 is positioned in the semiconductor structure such that the silicon carbide substrate 17 is between the first ohmic contact 25 and the first n-type cladding layer 11. The second ohmic contact 26 is positioned in the semiconductor structure such that the p-type layer 18 is between the second ohmic contact 26 and the second n-type cladding layer 12.

Preferably, the first ohmic contact 25 is placed directly on the silicon carbide substrate 17, opposite the first n-type cladding layer 11 (or opposite the conductive buffer layer 23 or discrete crystal portions 28, depending on the particular structural embodiment), and the second ohmic contact 26 is placed directly on the p-type layer 18, opposite the second n-type cladding layer 12. In a variant of this embodiment, the p-type layer 18 is sandwiched between the second ohmic contact 26 and a second p-type layer (not shown).

As recognized by those of ordinary skill in this art, the conductive buffer layer 23 provides a physical and electronic transition between the silicon carbide substrate 17 and the first n-type cladding layer 11. In many circumstances, the presence of the conductive buffer layer 23 helps ease the physical strain that can result from the lattice differences between the silicon carbide substrate 17 and the first n-type cladding layer 11. Furthermore, to preserve the vertical function of the device, the conductive buffer layer 23 has to be sufficiently conductive to carry the desired or required current to operate the semiconductor device 10. Likewise, the transition layer 24 serves a similar physical and electronic transition.

The ohmic contacts 25 and 26, which complete the advantageous vertical structure of the invention, are preferably formed of a metal such as aluminum (Al), nickel (Ni), titanium (Ti), gold (Au), platinum (Pt), vanadium (V), alloys, or blends thereof, or sequential layers of two or more of these metals, but also may be formed of other ohmic contact materials known by those skilled in the art provided that they exhibit ohmic character and do not otherwise interfere with the structure or function of the light-emitting device 10.

To the extent that the first ohmic contact 25 is formed to the silicon carbide substrate 17, the invention is distinguished from those devices that employ sapphire. Sapphire cannot be made conductive, and so cannot be connected to an ohmic contact. Consequently, sapphire-based devices cannot be formed into the kinds of vertical structures that are most preferred for LEDs.

Accordingly, in one preferred embodiment the invention is a semiconductor structure for light emitting devices that includes an n-type single crystal silicon carbide substrate 17 of a 3C, 4H, 6H, or 15R polytype; a p-type layer 18 formed of at least one Group III nitride selected from the group consisting of gallium nitride (preferably magnesium-doped gallium nitride), indium nitride, and indium gallium nitride having the formula $In_xGa_{1-x}N$, where $0<x<1$; an undoped active layer of $Al_xIn_yGa_{1-x-y}N$, where $0\leq x<1$ and $0\leq y\leq 1$ and $(x+y)\leq 1$; a first n-type cladding layer 11 of $Al_xIn_yGa_{1-x-y}N$, where $0\leq x\leq 1$ and $0\leq y<1$ and $(x+y)\leq 1$; and a second n-type cladding layer 12 of $Al_xIn_yGa_{1-x-y}N$, where $0\leq x\leq 1$ and $0\leq y<1$ and $(x+y)\leq 1$. Most preferably, the p-type layer 18 comprises a superlattice formed from alternating layers of any two of the aforementioned Group III nitrides.

As disclosed previously, the first n-type cladding layer 11 and the second n-type cladding layer 12 have respective bandgaps that are each larger than the bandgap of the active layer 13. Moreover, the first n-type cladding layer 11 is positioned between the silicon carbide substrate 17 and the active layer 13, the second n-type cladding layer 12 is positioned between the active layer 13 and the p-type layer 18, and the active layer 13 is positioned between the first n-type cladding layer 11 and the second n-type cladding layer 12.

The composition of the first n-type cladding layer 11 can be progressively graded such that the crystal lattice at its first surface 21 more closely matches the crystal lattice of the silicon carbide 17, and the crystal lattice at its second surface 22 more closely matches the crystal lattice of the active layer 13. Similarly, the composition of the second n-type cladding layer 12 can be progressively graded such that the crystal lattice at its second surface more closely matches the crystal lattice of the p-type layer 18. As previously noted, progressively grading across an epitaxial layer embraces both grading in steps and grading continuously (i.e., without steps). Causing the n-type cladding 12 to be substantially lattice matched to the p-type layer 18 reduces the number of interface states at the p-n junction formed between the layers. Because such states may result in nonradiative recombination, reducing the number of such states improves the recombination efficiency, thus improving overall device efficiency in the active layer 13.

Furthermore, and in accordance with the previous descriptions, this preferred structure may also include one or more of the following layers-a third n-type cladding layer 19, the conductive buffer layer 23, the Group III nitride transition layer 24, the discrete crystal portions 28, and the ohmic contacts 25 and 26. In this regard, the conductive buffer layer 23 most preferably is aluminum gallium nitride having the formula $Al_xGa_{1-x}N$, where $0\leq x\leq 1$.

FIGS. 8, 9, 10, 11 and 12 are bandgap diagrams of various structures, including embodiments of the present invention. All of the bandgap diagrams 8 through 12 represent the bandgaps under forward bias (i.e. "flat-band" conditions). It will be understood by a skilled person that the bandgap diagrams 8 through 12 are schematic in nature and are not necessarily drawn to scale. While they illustrate important aspects of the invention, it will be understood that the actual band structure may vary slightly from the illustration. In FIGS. 8-12, whenever possible, identical numerical designations will refer to identical portions of the diagrams.

Figure 8:
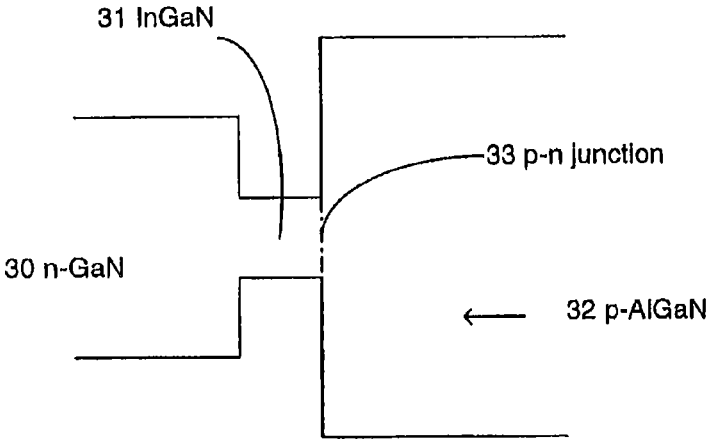
Figure 8 (Prior Art)
FIGS. 8 and 9 are bandgap diagrams corresponding to certain prior art devices.

FIG. 8 is a bandgap diagram of a prior art device showing an n-type gallium nitride clad layer 30, an indium gallium nitride active layer 31, and a p-type aluminum gallium nitride layer 32. In this device, the p-n junction is represented by the dotted line at 33.

With respect to the physical structure of the device and the interface quality between layers, interfaces between identical materials are the easiest to make of high quality. Among the Group III nitrides, the interface between gallium nitride and gallium nitride is the easiest to make of high quality, with the interface between gallium nitride and aluminum gallium nitride being more difficult, but easier than most others. The next-to-worst is the interface between gallium nitride and indium gallium nitride, with the worst interface quality being typically demonstrated between indium gallium nitride and aluminum gallium nitride.

Furthermore, it will be recalled that the disassociation temperature of indium gallium nitride is generally less than all of the other Group III nitrides. Accordingly, once the InGaN active layer has been grown, the growth temperatures for the remaining layers must be limited to temperatures that avoid undesired disassociation or degradation of the indium gallium nitride layer. Stated differently, if the InGaN active layer were absent, the AlGaN and GaN layers could be grown at higher temperatures that are more favorable (all other factors being equal) for higher quality epitaxial layers of these materials.

As a result, at the lower growth temperatures used to grow the aluminum gallium nitride layers that are required to protect the indium gallium nitride layer, the resulting quality of the aluminum gallium nitride layers is somewhat less than it would be if the layers could be grown at a higher temperature.

Accordingly, although ordinarily an AlGaN—AlGaN interface would be considered to make a good homojunction, under the lower growth temperatures required to protect the desired indium gallium nitride active layer of the present invention, the aluminum gallium nitride layers are of poor quality, with the p-type aluminum gallium nitride layers being particularly bad. As a result, for devices that incorporate indium gallium nitride active layers, interfaces and junctions between p-type aluminum gallium nitride and n-type aluminum gallium nitride, are generally of very low quality. Thus the invention's avoidance of such junctions is counterintuitive and produces an unexpectedly better device. Stated differently, prior art devices that incorporate the structure of FIG. 8 require interfaces between Group III nitrides that are difficult to form with high quality.

Figure 9:
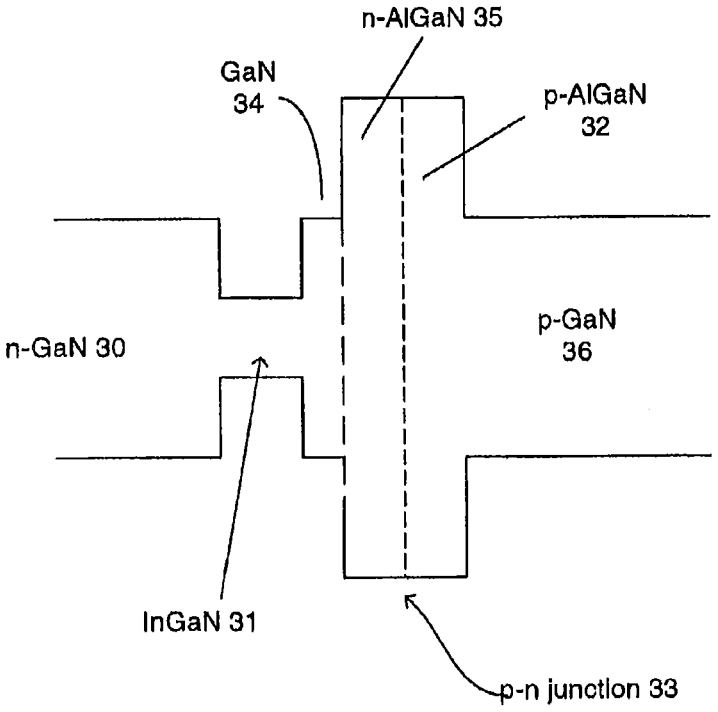

FIG. 9 illustrates a device described in copending and commonly assigned application Ser. No. 09/154,363 filed Sep. 16, 1998. As in FIG. 8, the n-type gallium nitride layer is designated at 30, the indium gallium nitride active layer is at 31, the p-n junction is at 33, and the p-type aluminum gallium nitride is designated at 32. The device illustrated in FIG. 9, however, also includes an additional n-type gallium nitride clad layer 34 that provides a slightly better interface with the indium gallium nitride active layer 31; i.e. the adjacent GaN—InGaN layer tends to provide the opportunity for a higher quality interface than do adjacent AlGaN—InGaN layers. FIG. 9 also illustrates an n-type aluminum gallium nitride layer 35 between the second gallium nitride layer 34 and the p-type aluminum gallium nitride layer 32. Finally, FIG. 9 includes an additional p-type gallium nitride layer 36 as a top contact layer. This device offers the advantage of having the p-n junction 33 formed between adjacent layers of aluminum gallium nitride, and the GaN layer 34 likewise provides a slightly better interface with the indium gallium nitride active layer 31 than does the AlGaN layer 32 of FIG. 8.

Figure 10:
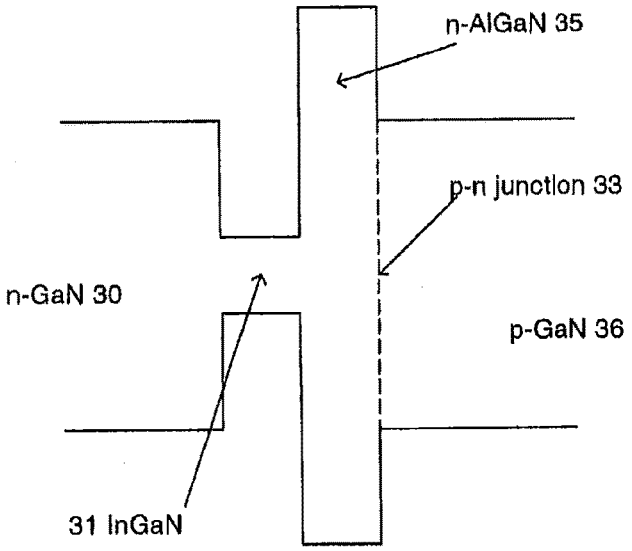
FIGS. 10-12 are bandgap diagrams for devices according to the present invention.

FIG. 10 illustrates the bandgap relationships of the embodiment of the present invention as illustrated in FIG. 1 in which the n-type gallium nitride layer 30 (11 in FIG. 1) is again a clad layer for the indium gallium nitride active layer 31 (13 in FIG. 1). The opposing clad layer 36 is formed of n-type aluminum gallium nitride, and the device is completed with the p-type gallium nitride layer 36, thus defining the p-n junction 33 between the n-type AlGaN layer 35 and the p-type gallium nitride layer 36. This offers the advantage of having the p-n junction at the interface between the n-type aluminum gallium nitride 35 and the p-type gallium nitride 36. As noted above, other than an GaN—GaN junction, the AlGaN—GaN junction is the one most easily formed at the quality required for successful devices.

Figure 11:
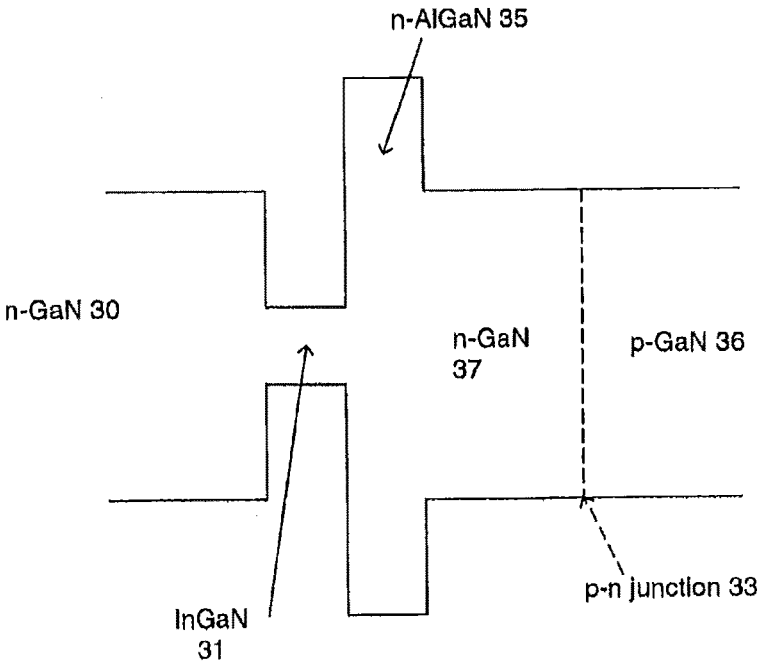

FIG. 11 illustrates another embodiment of the present invention in which the first clad layer is the n-type gallium nitride layer 30, the active layer is indium gallium nitride 31, and the second clad layer is n-type aluminum gallium nitride 35. This embodiment, however, includes an additional layer of n-type gallium nitride 37 adjacent the n-type aluminum gallium nitride layer 35. As a result the p-n junction is formed between n-type gallium nitride 37 and p-type gallium nitride 36 giving a GaN—GaN interface that provides the highest quality from a structural standpoint.

Figure 12:
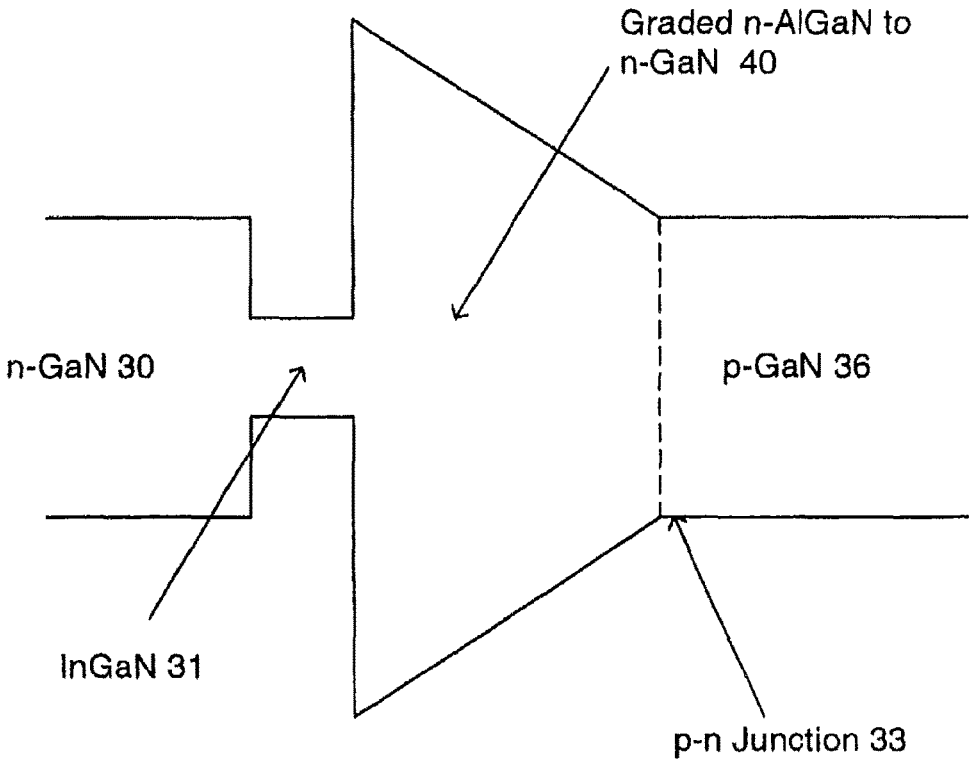

FIG. 12 illustrates another preferred embodiment in which the n-type gallium nitride layer 30 again forms one clad layer for the indium gallium nitride active layer 31. Similarly, the top contact layer is a p-type gallium nitride layer 36 as in FIGS. 10 and 11. As a clad and transition layer, FIG. 12 includes the portion 40 that is progressively compositionally graded between n-type aluminum gallium nitride at the interface with the InGaN active layer 31 and substantially entirely n-type gallium nitride at the interface with the p-type gallium nitride layer 36. As a result, the p-n junction 33 is again made as a homojunction between the n-GaN portion of the graded layer 40 and the p-GaN layer 36.

The thickness of the layer or layers between the active layer and the p-n junction affects the functionality of the device. Layers that are too thin fail to offer the appropriate confinement, while layers that are too thick allow too much recombination to take place in the thick layer rather than in the active layer as desired. Accordingly, with respect to the embodiment depicted in FIG. 1, clad layer 12 should be between about 30 and 70 Å thick. With respect to the embodiment depicted in FIG. 3, clad layer 12 should be between about 20 and 50_Å thick, and layer 19 should be between about 30 and 50 Å thick. The total thickness of layers 12 and 19 should preferably be no more than about 100 Å. With respect to the efficiency of the devices, one goal is to minimize the nonradiative recombination current ($J_{nr}$) while maximizing the radiative combination current ($J_r$). In this regard, the structure shown in FIG. 8 has the greatest (i.e., least desirable) nonradiative recombination current. The nonradiative recombination current of the device of FIG. 9 is somewhat less than that of FIG. 8, but still greater than the more favorably lower nonradiative recombination current of FIG. 10, 11 or 12.

In the drawings and the specification, typical embodiments of the invention have been disclosed. Specific terms have been used only in a generic and descriptive sense, and not for purposes of limitation. The scope of the invention is set forth in the following claims.

That which is claimed is:

1. A semiconductor structure for light emitting devices [that can emit in the red to ultraviolet portion of the electromagnetic spectrum], said structure comprising:

a first n-type layer of $Al_xIn_yGa_{1-x-y}N$, where $0 \le x \le 1$ and $0 \le y < 1$ and [$0<(x+y) \le 1$] *$(x+y) \le 1$;* a second n-type layer of $Al_xIn_yGa_{1-x-y}N$, where $0 \le x \le 1$ and $0 \le y < 1$ and [$0(x+y) \le 1$] *$(x+y) \le 1$*, wherein said second n-type layer is undoped;

an active layer of $Al_xIn_yGa_{1-x-y}N$, where $0 \le x < 1$ and $0 \le y \le 1$ and $(x+y) \le 1$, wherein said active layer is n-type and is positioned between said first n-type layer and said second n-type layer; [and]

a p-type layer of a Group III nitride on said second n-type layer, wherein said second n-type layer [forms a p-n junction with] *is positioned between* said p-type layer *and said active layer*; and

*a third n-type layer of $Al_xIn_yGa_{1-x-y}N$, where $0 \le x \le 1$ and $0 \le y < 1$ and $(x+y) \le 1$, wherein said third n-type layer is positioned between said second n-type layer and said p-type layer,* wherein [said n-type layers have a higher fraction of gallium than said active layer, such that] said first and second n-type layers have respective bandgaps that are each larger than the bandgap of said active layer, *and wherein at least one of said first and second n-type layers comprises aluminum.*

2. A semiconductor structure according to claim 1, wherein said active layer has a first surface and a second surface, said first surface of said active layer being in contact with said first n-type layer and said second surface of said active layer being in contact with said second n-type layer.

3. A semiconductor structure according to claim 1, [wherein said second n-type layer has a first surface and a second surface, said first surface of said second n-type layer being in contact with said active layer, and said second surface of said second n-type layer being in contact with said p-type layer,] wherein [the] *a* composition of [said second n-type layer] *at least one of the layers between said active layer and said p-type layer* is [progressively] graded [such that the crystal lattice at said first surface of said second n-type layer more closely matches the crystal lattice of said active layer, and the crystal lattice at said second surface of said second n-type layer more closely matches the crystal lattice of said p-type layer].

4. A semiconductor structure according to claim 1, wherein said p-type layer is in contact with said [second] *third* n-type layer[, opposite said active layer].

5. A semiconductor structure according to claim 1, wherein said second n-type layer consists essentially of $Al_xGa_{1-x}N$, where $0<x<1$.

6. A semiconductor structure according to claim 1, wherein said active layer consists essentially of $In_yGa_{1-y}N$, where $0<y<1$.

7. A semiconductor structure according to claim 1, wherein said p-type layer is magnesium-doped gallium nitride.

8. A semiconductor structure according to claim 7, wherein said second n-type layer is thick enough to deter migration of magnesium from said p-type layer to said active layer, yet thin enough to facilitate recombination in said active layer.

9. A semiconductor structure according to claim 1, wherein said p-type layer is indium nitride.

10. A semiconductor structure according to claim 1, wherein said p-type layer is $In_xGa_{1-x}N$, where $0<x<1$.

11. A semiconductor structure according to claim 1, wherein said p-type layer comprises a superlattice formed from a plurality of Group III nitride layers selected from the group consisting of gallium nitride, indium nitride, and $In_xGa_{1-}x$ N, where $0<x<1$.

12. A semiconductor structure according to claim 11, wherein said superlattice is formed from alternating layers of two Group III nitride layers selected from the group consisting of gallium nitride, indium nitride, and $In_xGa_{1-x}N$, where $0<x<1$.

13. A semiconductor structure according to claim 1, [further comprising a] *wherein:*

*the first n-type layer comprises $Al_xIn_yGa_{1-x-y}N$, where $0\leq x\leq 1$ and $0\leq y<1$ and $0<(x+y)\leq 1$;*

*the second n-type layer comprises $Al_xIn_yGa_{1-x-y}N$, where $0\leq x\leq 1$ and $0\leq y<1$ and $0<(x+y)\leq 1$; and*

*the* third n-type layer [of $Al_xIn_yGa_{1-x-y}N$, where $0\leq x\leq 1$ and $0\leq y<1$ and $(x+y)\leq 1$, wherein said third n-type layer is positioned between said second n-type layer and] *forms a p-n junction with* said p-type layer.

14. A semiconductor structure according to claim 13, wherein said third n-type layer has a first surface and a second surface, said first surface of said third n-type layer being in contact with said p-type layer and said second surface of said third n-type layer being in contact with said second n-type layer.

15. A semiconductor structure according to claim 1, further comprising an n-type silicon carbide substrate, wherein said first n-type layer is positioned between said silicon carbide substrate and said active layer.

16. A semiconductor structure according to claim 15, further comprising discrete crystal portions selected from the group consisting of gallium nitride and indium gallium nitride, said discrete crystal portions positioned between said first n-type layer and said silicon carbide substrate, said discrete crystal portions being present in an amount sufficient to reduce the baffler between said first n-type layer and said silicon carbide substrate, but less than an amount that would detrimentally affect the function of any resulting light emitting device formed on said silicon carbide substrate.

17. A semiconductor structure according to claim 1, further comprising:

an n-type-silicon carbide substrate; and a conductive buffer layer positioned between said silicon carbide substrate and said first n-type layer.

18. A semiconductor structure according to claim 17, wherein said conductive buffer layer has a first surface and a second surface, said first surface of said conductive buffer layer being in contact with said silicon carbide substrate and said second surface of said conductive buffer layer being in contact with said first n-type layer.

19. A semiconductor structure according to claim 17, wherein said conductive buffer layer consists essentially of aluminum gallium nitride having the formula $Al_xGa_{1-x}N$, where $0<x<1$.

20. A semiconductor structure according to claim 17, further comprising an n-type transition layer of a Group III nitride, said transition layer being positioned between said conductive buffer layer and said first n-type layer.

21. A semiconductor structure according to claim 17, further comprising discrete crystal portions selected from the group consisting of gallium nitride and indium gallium nitride, said discrete crystal portions positioned between said conductive buffer layer and said silicon carbide substrate, said discrete crystal portions being present in an amount sufficient to reduce the barrier between said conductive buffer layer and said silicon carbide substrate, but less than an amount that would detrimentally affect the function of any resulting light emitting device formed on said silicon carbide substrate.

22. A semiconductor structure for light emitting devices [that can emit in the red to ultraviolet portion of the electromagnetic spectrum,] said structure comprising:

a first [n-type] layer of $Al_xIn_yGa_{1-x-y}N$, where $0\leq x\leq 1$ and $0\leq y<1$ and $(x+y)\leq 1$;

a second [n-type] layer of $Al_xIn_yGa_{1-x-y}N$, where $0\leq x<1$ and $0\leq y<1$ and $(x+y)\leq 1$[, wherein said second n-type layer is an undoped layer having a first surface and a second surface];

an active layer of $Al_xIn_yGa_{1-x-y}N$, where $0\leq x<1$ and $0\leq y\leq 1$ and $(x+y)\leq 1$, wherein said active layer [is n-type and] is positioned between said first [n-type] layer and [the first surface of] said second [n-type] layer; and a p-type layer of a Group III nitride, wherein said second [n-type] layer is positioned between said p-type layer and said active layer;

[wherein said first and second n-type layers have respective bandgaps that are each larger than the bandgap of said active layer; and] wherein [ [*at least one of said first layer and*] ] said second [n-type] layer is n-type and is compositionally graded [in steps from said first surface to said second surface].

23. A semiconductor structure according to claim 22, wherein *said second layer is compositionally graded such that* a crystal lattice at [said] *a* first surface of said second [n-type] layer *proximate said active layer* substantially matches a crystal lattice of said active layer.

24. A semiconductor structure according to claim 22, wherein said first *layer is* n-type [layer] *and* is compositionally graded [in steps] such that a crystal lattice *at a first surface* of said first [n-type] layer proximate said active layer substantially matches a crystal lattice of said active layer.

25. A semiconductor structure for light emitting devices [that can emit in the red to ultraviolet portion of the electromagnetic spectrum], said structure comprising:

a first n-type layer of $Al_xIn_yGa_{1-x-y}N$, where $0\leq x\leq 1$ and $0\leq y<1$ and $(x+y)\leq 1$;

a second n-type layer of $Al_xIn_yGa_{1-x-y}N$, where $0\leq x\leq 1$ and $0\leq y<1$ and $(x+y)\leq 1$, wherein said second n-type layer is undoped;

an active layer of $Al_xIn_yGa_{1-x-y}N$, where $0\leq x<1$ and $0\leq y\leq 1$ and $(x+y)\leq 1$, wherein said active layer is n-type and is positioned between said first n-type layer and said second n-type layer; and a p-type superlattice formed of layers of Group III nitrides, wherein said second n-type layer is positioned between said p-type superlattice and said active layer.

26. A semiconductor structure [according to claim 25] *for light emitting devices, said structure comprising:*

*a first n-type layer of $Al_xIn_yGa_{1-x-y}N$, where $0\leq x\leq 1$ and $0\leq y<1$ and $(x+y)\leq 1$;*

*a second n-type layer of $AlxIn_yGa_{1-x-y}N$, where $0\leq x\leq 1$ and $0\leq y<1$ and $(x+y)\leq 1$, wherein said second n-type layer is undoped;*

*an active layer of $Al_xIn_yGa_{1-x-y}N$, where $0 \le x < 1$ and $0 \le y \le 1$ and $(x+y) \le 1$, wherein said active layer is n-type and is positioned between said first n-type layer and said second n-type layer;*

*p-type layers of Group III nitrides, wherein said second n-type layer is positioned between said p-type layers and said active layer; and* wherein said *p-type* layers [of said p-type superlattice] are selected from the group consisting of gallium nitride, indium nitride, and $In_xGa_{1-x}N$, where $0<x<1$.

27. A semiconductor structure according to claim 25, wherein said superlattice is formed from alternating layers of two Group III nitride layers selected from the group consisting of gallium nitride, indium nitride, and $In_xGa_{1-x}N$, where $0<x<1$.

28. A semiconductor structure [according to claim 25, further] *for light emitting devices, said structure* comprising:

*a first n-type layer of $Al_xIn_yGa_{1-x-y}N$, where $0 \le x \le 1$ and $0 \le y < 1$ and $(x+y) \le 1$;*

*a second n-type layer of $AlxIn_yGa_{1-x-y}N$, where $0 \le x \le 1$ and $0 \le y < 1$ and $(x+y) \le 1$, wherein said second n-type layer is undoped;*

*an active layer of $Al_xIn_yGa_{1-x-y}N$, where $0 \le x < 1$ and $0 \le y \le 1$ and $(x+y) \le 1$, wherein said active layer is n-type and is positioned between said first n-type layer and said second n-type layer;*

*p-type layers of Group III nitrides, wherein said second n-type layer is positioned between said p-type layers and said active layer; and* a third n-type layer of $Al_xIn_yGa_{1-x-y}N$, where $0 \le x \le 1$ and $0 \le y < 1$ and $(x+y) \le 1$, wherein said third n-type layer is positioned between said second n-type layer and said p-type [superlattice] *layers.*

29. A semiconductor structure according to claim 28, wherein said third n-type layer has a first surface and a second surface, said first surface of said third n-type layer being in contact with *one of* said p-type [superlattice] *layers* and said second surface of said third n-type layer being in contact with said second n-type layer.

*30. The structure of claim 23, wherein the p-type layer comprises $In_xGa_{1-x}N$ wherein $0 \le x \le 1$.*

*31. The structure of claim 30, wherein the second layer* [[*is an n-type layer that*]] *is doped or undoped.*

*32. A semiconductor structure for a light emitting device, comprising:*

*a first Group III nitride layer comprising n-type $Al_xIn_yGa_{1-x-y}N$ wherein $0 \le x \le 1$ and $0 \le y < 1$ and $(x+y) \le 1$;*

*a Group III nitride based active layer comprising a quantum well on the first Group III nitride layer;*

*a second Group III nitride layer on the active layer opposite the first Group III nitride layer, the second Group III nitride layer comprising n-type $Al_xIn_yGa_{1-x-y}N$ wherein $0 \le x \le 1$ and $0 \le y < 1$ and $(x+y) \le 1$; and*

*a third Group III nitride layer on the second Group III nitride layer opposite the active layer, the third Group III nitride layer comprising n-type $Al_xIn_yGa_{1-x-y}N$ wherein $0 \le x \le 1$ and $0 \le y < 1$ and $(x+y) \le 1$,*

*wherein at least one of the first and second Group III nitride layers comprises aluminum*, and wherein the second and third Group III nitride layers are between the active layer and a p-type layer.

*33. The structure of claim 32, wherein the at least one of the first and second Group III nitride layers has a higher fraction of aluminum than the active layer.*

*34. The structure of claim 32, wherein the second Group III nitride layer comprises $Al_xGa_{1-x}N$ wherein $0<x<1$.*

*35. The structure of claim 32, further comprising:*

*a fourth Group III nitride layer on the third Group III nitride layer opposite the second Group III nitride layer.*

*36. The structure of claim 35, wherein the fourth Group III nitride layer comprises n-type $Al_xIn_yGa_{1-x-y}N$ wherein $0 \le x \le 1$ and $0 \le y < 1$ and $(x+y) \le 1$.*

*37. The structure of claim 35, wherein at least one of the second, third, and fourth Group III nitride layers is undoped.*

*38. The structure of claim 35, wherein the fourth Group III nitride layer comprises a magnesium-doped p-type Group III nitride layer comprising $In_xGa_{1-x}N$ wherein $0 \le x \le 1$.*

*39. The structure of claim 38, wherein the fourth Group III nitride layer comprises a superlattice formed from a plurality of Group III nitride layers selected from the group consisting of gallium nitride, indium nitride, and $In_xGa_{1-x}N$ wherein $0<x<1$.*

*40. The structure of claim 32, wherein at least one of the first and second Group III nitride layers is graded.*

*41. A semiconductor structure for a light emitting device, comprising:*

*a first Group III nitride layer comprising $Al_xIn_yGa_{1-x-y}N$ wherein $0 \le x \le 1$ and $0 \le y < 1$ and $(x+y) \le 1$;*

*a Group III nitride based active layer comprising a quantum well on the first Group III nitride layer;*

*a second Group III nitride layer comprising $Al_xIn_yGa_{1-x-y}N$ wherein $0 \le x \le 1$ and $0 \le y < 1$ and $(x+y) \le 1$ on the active layer opposite the first Group III nitride layer;*

*a third Group III nitride layer comprising n-type $Al_xIn_yGa_{1-x-y}N$ wherein $0 \le x \le 1$ and $0 \le y < 1$ and $(x+y) \le 1$ on the second Group III nitride layer opposite the active layer; and*

*a fourth Group III nitride layer comprising* p-type *$Al_xIn_yGa_{1-x-y}N$ wherein $0 \le x \le 1$ and $0 \le y < 1$ and $(x+y) \le 1$ on the third Group III nitride layer opposite the second Group III nitride layer,*

*wherein at least one of the first and second Group III nitride layers comprises aluminum, and wherein at least one of the second,* and *third*[[*, and fourth*]] *Group III nitride layers is undoped.*

*42. The structure of claim 41, wherein the fourth Group III nitride layer comprises p-type $In_xGa_{1-x}N$ wherein $0 \le x \le 1$.*

*43. The structure of claim 42, wherein one of the layers between the active layer and the fourth Group III nitride layer comprises a graded layer.*

*44. The structure of claim 41, wherein at least one of the first and second Group III nitride layers comprises a graded n-type layer.*

45. The structure of claim 40, wherein the at least one of the first and second Group III nitride layers is graded continuously.

46. The structure of claim 40, wherein the at least one of the first and second Group III nitride layers is graded in steps.

47. A semiconductor structure according to claim 1, wherein said third n-type layer forms a p-n homojunction with said p-type layer.

48. A semiconductor structure according to claim 22, wherein the second layer is doped or undoped.

* * * * *